(12) United States Patent
Li et al.

(10) Patent No.: US 11,830,842 B2
(45) Date of Patent: Nov. 28, 2023

(54) HYBRID DEVICE ASSEMBLIES AND METHOD OF FABRICATION

(71) Applicant: NXP USA, Inc., Austin, TX (US)

(72) Inventors: Li Li, Scottsdale, AZ (US); Lakshminarayan Viswanathan, Phoenix, AZ (US); Jeffrey Kevin Jones, Chandler, AZ (US)

(73) Assignee: NXP USA., Inc., Austin, TX (US)

(*) Notice: Subject to any disclaimer, the term of this patent is extended or adjusted under 35 U.S.C. 154(b) by 6 days.

(21) Appl. No.: 17/078,058

(22) Filed: Oct. 22, 2020

(65) Prior Publication Data

US 2022/0130785 A1    Apr. 28, 2022

(51) Int. Cl.
*H01L 23/00* (2006.01)
*H01L 21/48* (2006.01)
(Continued)

(52) U.S. Cl.
CPC .......... *H01L 24/02* (2013.01); *H01L 21/4853* (2013.01); *H01L 21/4857* (2013.01); *H01L 21/4871* (2013.01); *H01L 21/78* (2013.01); *H01L 23/367* (2013.01); *H01L 23/5383* (2013.01); *H01L 23/5386* (2013.01); *H01L 24/19* (2013.01); *H01L 2224/214* (2013.01); *H01L 2924/1033* (2013.01); *H01L 2924/10253* (2013.01); *H01L 2924/10271* (2013.01);
(Continued)

(58) Field of Classification Search
CPC . H01L 24/20; H01L 21/4853; H01L 21/4857; H01L 21/4871; H01L 21/78; H01L 23/367; H01L 23/5383; H01L 23/5386; H01L 24/19; H01L 2224/214; H01L 2924/10253; H01L 2924/10271; H01L 2924/1033; H01L 2924/13091; H01L 2924/19105
See application file for complete search history.

(56) References Cited

U.S. PATENT DOCUMENTS 7,354,782 B2    4/2008  Mishra et al.
9,142,743 B2    9/2015  Chuang et al.
(Continued)

FOREIGN PATENT DOCUMENTS

JP    3-142869 A    6/1991
JP    2006-54310 A    2/2006

OTHER PUBLICATIONS

Green, Daniel S. et al; "A Revolution on the Horizon from DARPA"; IEEE Microwave Magazine; 16 pages (Mar./Apr. 2017).
(Continued)

*Primary Examiner* — Fernando L Toledo
*Assistant Examiner* — Neil R Prasad

(57) ABSTRACT

A device assembly includes a functional substrate having one or more electronic components formed there. The functional substrate has a cavity extending from a first surface toward a second surface of the functional substrate at a location that lacks the electronic components. The device assembly further includes a semiconductor die placed within the cavity with a pad surface of the semiconductor die being opposite to a bottom of the cavity. The functional substrate may be formed utilizing a first fabrication technology and the semiconductor die may be formed utilizing a second fabrication technology that differs from the first fabrication technology.

20 Claims, 6 Drawing Sheets

(51) Int. Cl.
    *H01L 21/78*     (2006.01)
    *H01L 23/367*     (2006.01)
    *H01L 23/538*     (2006.01)

(52) U.S. Cl.
    CPC ............... *H01L 2924/13091* (2013.01); *H01L 2924/19105* (2013.01)

(56) References Cited

U.S. PATENT DOCUMENTS

| | | | |
|---|---|---|---|
| 10,608,125 B1* | 3/2020 | Zhou | H01L 31/0203 |
| 2011/0089531 A1 | 4/2011 | Hillman et al. | |
| 2011/0233718 A1 | 9/2011 | Kim et al. | |
| 2014/0035114 A1* | 2/2014 | Gogoi | H01L 23/142 |
| | | | 257/676 |
| 2014/0252655 A1* | 9/2014 | Tran | H01L 23/13 |
| | | | 257/777 |
| 2015/0016078 A1* | 1/2015 | Yang | C23C 28/40 |
| | | | 361/762 |
| 2015/0162308 A1 | 6/2015 | Kraft et al. | |
| 2015/0179608 A1* | 6/2015 | Sung | H01L 25/0652 |
| | | | 257/777 |
| 2017/0213793 A1 | 7/2017 | Hurwitz et al. | |
| 2017/0280374 A1* | 9/2017 | Hayes | H04W 56/0015 |
| 2017/0287872 A1* | 10/2017 | Shen | H01L 23/367 |
| 2018/0122778 A1* | 5/2018 | Rahim | H01L 24/73 |
| 2018/0182727 A1 | 6/2018 | Yu | |
| 2019/0287951 A1 | 9/2019 | Kim et al. | |
| 2020/0364600 A1* | 11/2020 | Elsherbini | H01L 21/486 |
| 2021/0098375 A1* | 4/2021 | Foo | H01L 21/76877 |

OTHER PUBLICATIONS

Green, Daniel S.; Common Heterogeneous Integration and Intellectual Property (IP) Reuse Strategies (CHIPS); US Defense Advanced Research Projects Agency (DARPA); Falls Church, VA, US; 32 pages (Sep. 21, 2016).

Raman, Sanjay et al; "The DARPA Diverse Accessible Heterogeneous Integration (DAHI) Program: Towards a Next-Generation Technology Platform for High-Performance Microsystems"; CS Mantech Conference, Boston, MA, USA; 4 pages (Apr. 23-26, 2012).

Herrault, Florian et al., "Metal-Embedded Chiplet Assembly for Microwave Integrated Circuits", IEEE Transactions on Components, Packaging and Manufacturing Technology, Sep. 1, 2020, vol. 10, No. 9, IEEE, Piscataway, NJ, USA.

* cited by examiner

US 11,830,842 B2

HYBRID DEVICE ASSEMBLIES AND METHOD OF FABRICATION

TECHNICAL FIELD OF THE INVENTION

The present invention relates generally to semiconductor devices. More specifically, the present invention relates to hybrid semiconductor device assemblies and fabrication methodology therefor.

BACKGROUND OF THE INVENTION

Emerging semiconductor technologies, such as microwave and millimeter wave (mmW) systems are under increasing pressure to function within limited power budgets on platforms with reduced size, weight, and cost constraints. Current semiconductor package technologies (e.g., radio frequency (RF) packages) include modules with organic substrates and discrete leadframe packages with air cavity or over-molding. These architectures are challenged by substrate and passive component losses, as well as decreased active device performance, at higher frequencies. Additionally, at high frequencies, such as millimeter wave (mmW) frequencies, traditional wirebond interconnects can have significant manufacturing variations, such as wirebond loop heights and length variations, that may adversely impact RF performance.

SUMMARY

Aspects of the disclosure are defined in the accompanying claims.

In a first aspect, there is provided a device assembly comprising a functional substrate having a first surface and a second surface opposing the first surface, the functional substrate having one or more electronic components formed therein, and the functional substrate having a cavity extending from the first surface toward the second surface at a location that lacks the one or more electronic components, and a semiconductor die placed within the cavity with a pad surface of the semiconductor die being opposite to a bottom of the cavity.

In a second aspect, there is provided a method of fabricating a device assembly comprising providing a functional substrate having a first surface and a second surface opposing the first surface, the functional substrate having one or more electronic components formed therein, forming a cavity extending from the first surface into the functional substrate toward the second surface at a location that lacks the one or more electronic components, and placing a semiconductor die within the cavity with a pad surface of the semiconductor die being opposite to a bottom of the cavity.

In a third aspect, there is provided a device assembly comprising a functional substrate having a first surface and a second surface opposing the first surface, the functional substrate having one or more electronic components formed therein, the electronic components including at least one of an active component and a passive component formed in predesigned regions of the functional substrate, and the functional substrate having a cavity extending from the first surface toward the second surface at a location that lacks the one or more electronic components; a semiconductor die placed within the cavity with a pad surface of the semiconductor die being opposite to a bottom of the cavity; a build-up structure formed across the first surface of the functional substrate and the pad surface of the semiconductor die, the build-up structure including at least one layer of electrically conductive patterned material connected to a pad on the pad surface of the semiconductor die; and an electrically conductive connection element formed on an outermost layer of the patterned material, wherein the patterned material is configured to electrically couple the pad on the pad surface of the semiconductor die with the electrically conductive connection element.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns device assemblies and methodology for fabricating the device assemblies. More particularly, integrated or hybrid device assemblies are provided, as well as integration methodology of various active and passive components. Device assemblies with combinations of various active device technology and passive device technology may provide design flexibility to yield optimal device configurations and cost reductions. For example, a lower cost based device technology with added performance enhancements may be integrated with higher cost devices to provide performance advantages. Further, controlled interconnects may be utilized on such integrated device assemblies for enhanced high frequency (e.g., radio frequency, RF) performance. Additionally, the die backside may be exposed for thermal dissipation to enhance thermal performance.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structures.

Figure 1:
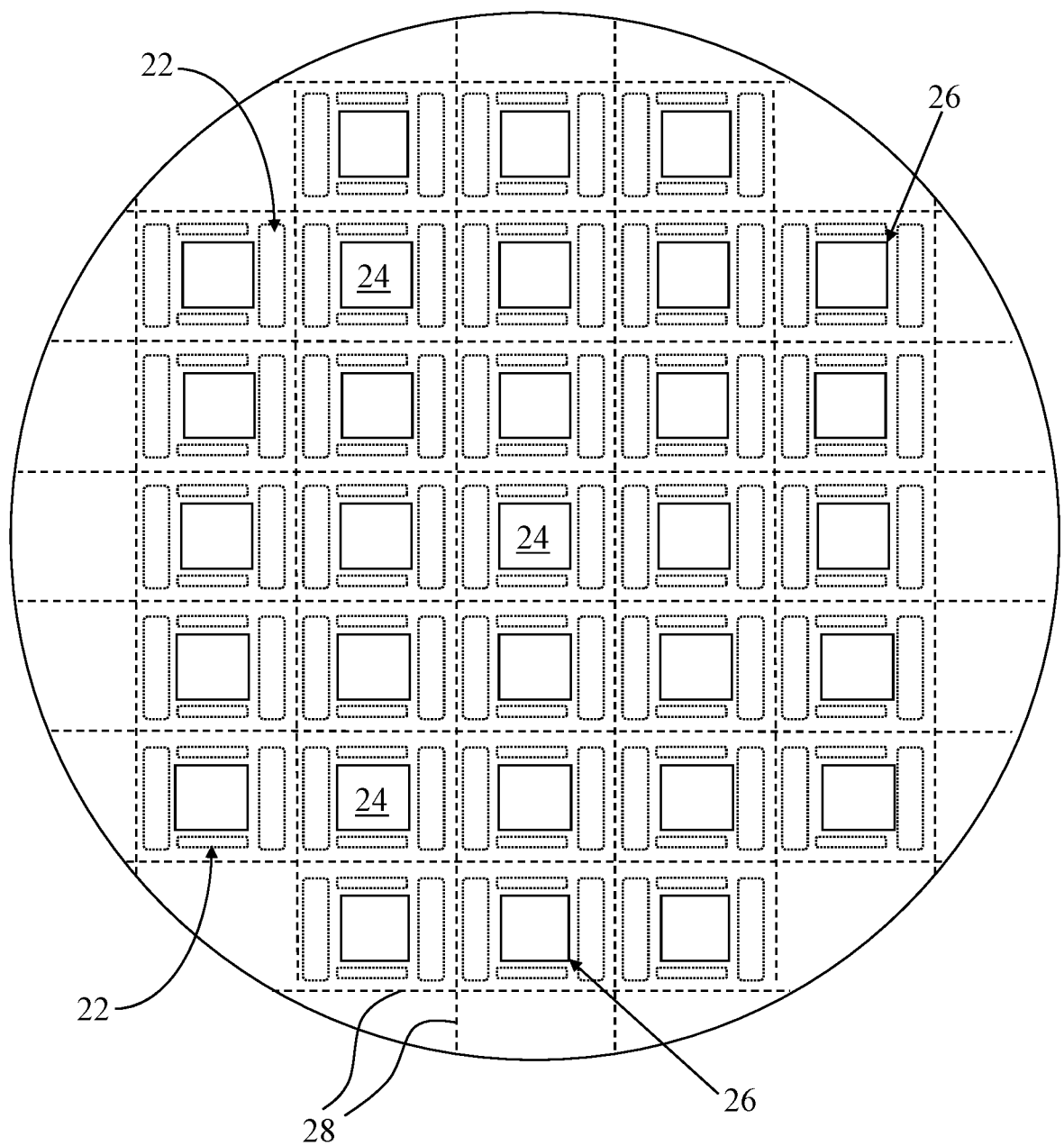
FIG. 1 shows a plan view of a functional wafer in accordance with an example embodiment.

FIG. 1 shows a plan view of a functional wafer 20 in accordance with an example embodiment. As used herein, the term "wafer" refers to a substrate used for microelectronic devices (e.g., electronic components) built in and upon the wafer. Further, as used herein, the term "functional" in combination with wafer refers to a substrate having microelectronic devices built into the wafer. As such, functional wafer 20 may have one or more electronic components (not shown) formed in predesigned regions 22 (denoted by dotted line boxes for simplicity) of functional wafer 20. The electronic components of functional wafer 20 may include at least one of an active component and a passive component, as will be discussed in greater detail below. Functional wafer 20 may undergo many microfabrication processes, such as doping, ion implantation, thin-film deposition of various material, and photolithographic patterning.

In FIG. 1, solid line boxes denote cavities 24 formed in functional wafer 20 at locations 26 that lack the electronic components. As will be discussed in significantly greater detail below, cavities 24 may be utilized for placement of semiconductor dies (not shown), and subsequent processing operations may be formed to produce multiple device assemblies using functional wafer 20. Thereafter, functional wafer 20, also referred to herein as functional substrate wafer 20, may be separated into individual device assemblies by wafer dicing along scribelines or saw lanes 28 (denoted by dashed lines).

In some embodiments, functional wafer 20 may be a silicon-germanium-based (SiGe-based) device wafer, a silicon-based integrated passive device (Si-based IPD) wafer, a silicon-based laterally-diffused metal-oxide semiconductor (Si-based LDMOS) device wafer, and so forth. A SiGe-based device wafer may have SiGe manufactured on a silicon wafer. A SiGe-based device wafer is typically utilized as a semiconductor material in integrated circuits (ICs) and may include heterojunction bipolar transistors in predesigned regions or may be implemented as a strain-inducing layer for CMOS transistors in predesigned regions 22. A Si-based IPD device wafer may include passive electronic components such as resistors, capacitors, inductors, impedance matching elements, baluns, or any combinations of such components integrated in predesigned regions 22. A Si-based LDMOS device wafer may include LDMOS transistors built-into predesigned regions 22 that are used, for example, in amplifiers. In other embodiments, functional wafer 20 may be a dielectric wafer, such as a glass wafer, having high quality passive electronic components (e.g., high-quality factor capacitors, resistors, inductors, and the like) formed in predesigned regions 22.

Figure 2:
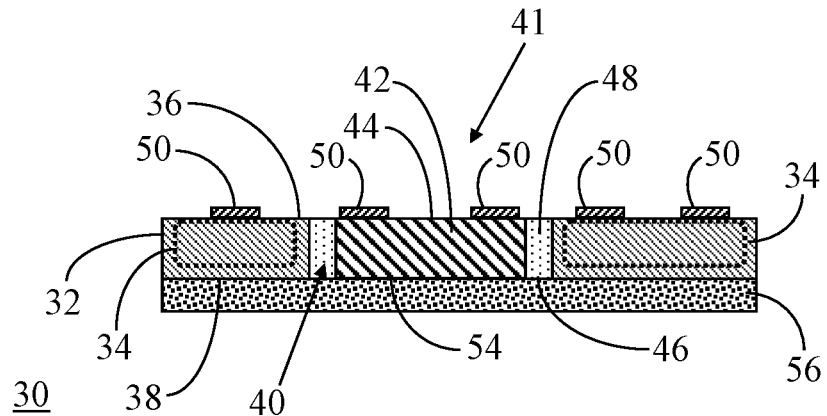
FIG. 2 shows a side view of a device assembly in accordance with an embodiment.

FIG. 2 shows a side view of a device assembly 30 in accordance with an embodiment. Device assembly 30 includes a functional substrate 32 having one or more electronic components 34 (denoted by dotted line boxes) formed therein. Functional substrate 32 may be a portion of functional wafer 20 (FIG. 1) circumscribed by saw lanes 28 (FIG. 1). As such, electronic components 34 may include any suitable quantity and number of passive and/or active components, as discussed above. Functional substrate 32 has a first surface 36 and a second surface 38 opposing first surface 36. A cavity 40 extends from first surface 36 toward second surface 38 at a location 41 that lacks electronic components 34. Thus, cavity 40 corresponds to one of cavities 24 (FIG. 1) in functional wafer 20.

A semiconductor die 42 is placed within cavity 40 with a pad surface 44 of semiconductor die 42 being opposite to a bottom 46 of cavity 40. In this example, semiconductor die 42 may be secured in cavity 40 using a dielectric material 48. In this example, bond pads 50 may be formed on first surface 36 of functional substrate 32 and on pad surface 44 of semiconductor die 42. Bond pads 50 may be used to interconnect electronic components 34 to semiconductor die 42 via bond wires (not shown) in some configurations.

Semiconductor die 42 has a bottom die surface 54 opposing pad surface 44. In some embodiments, bottom die surface 54 is exposed from functional substrate 32 at second surface 38 of functional substrate 32. In some embodiments, device assembly 30 may further include a backmetal structure 56 formed over second surface 38 of functional substrate 32 and over bottom die surface 54 of semiconductor die 42. Backmetal structure 56 may form a ground plane for device assembly 30.

As discussed above in connection with FIG. 1, functional substrate 32 (as a portion of functional wafer 20) may be a SiGe-based substrate, a Si-based IPD substrate, a Si-based LDMOS substrate, a dielectric substrate (e.g., glass substrate), and so forth. Conversely, semiconductor die 42 may be a gallium nitride-based (GaN) semiconductor die, a LDMOS semiconductor die, a gallium arsenide-based (GaAs) semiconductor die, a silicon carbide-based (SiC) semiconductor die, or any other suitable semiconductor die. Thus, functional substrate 32 (as a portion of functional wafer 20) may be formed utilizing a first fabrication technology and semiconductor die 42 may be fabricated utilizing a second fabrication technology that differs from the fabrication technology utilized to form functional substrate 32.

In an example, functional substrate 32 may be fabricated utilizing a SiGe Bipolar CMOS (BiCMOS) semiconductor fabrication technology that integrates bipolar junction transistors and a CMOS gate in a single integrated circuit device. SiGe BiCMOS may offer high speed, high gain, and low output resistance properties for high-frequency amplifiers. Semiconductor die 42 may be fabricated utilizing a GaN semiconductor fabrication technology. GaN-based transistors (e.g., semiconductor die 42) may offer high power density and high voltage breakdown limits, thereby making them optimal for applications such as high-power and high-frequency devices. Thus, a SiGe-based functional substrate 32 may be the baseline device technology for a millimeter wave device assembly 30 and the integration of GaN semiconductor die 42 inside SiGe-based functional substrate 32 may enhance high power performance.

A monolithic microwave integrated circuit (MMIC) is a type of integrated circuit that operates at microwave frequencies, and typically performs functions such as microwave mixing, power amplification, low-noise amplification, high-frequency switching, and so forth. GaN-based MMICs are being evaluated and implemented for wideband and high frequency applications. However, these GaN-based MMIC dies are undesirably large due to the inclusion of integrated passive devices on or in the GaN substrate, and the cost of GaN-based MMICs is commensurately high due to the die size needed to accommodate all of the matching elements. As such, in another example, functional substrate 32 may be fabricated as a lower cost system (e.g., Si-based or Glass) with electronic components 34 being the integrated passive devices and matching elements required for the MMIC, while semiconductor die 42 may include GaN-based transistors. Since the matching elements (e.g., electronic components 34) are implemented in functional substrate 32 instead of the GaN-based semiconductor die 42, a size reduction of GaN-based semiconductor die 42 relative to GaN-based MMIC dies, may be achieved.

Two examples of device assembly 30 are presented above, including a GaN-based semiconductor die inside a SiGe-based functional substrate and a GaN-based semiconductor die inside a Si-based or dielectric functional substrate. It should be understood that a wide variety of hybrid, or integrated, device assemblies may be envisioned. These include, but are not limited to, GaN-based semiconductor die inside a functional substrate having active LDMOS and/or integrated passive device predesigned regions (e.g., predesigned regions 22, FIG. 1), GaN-based semiconductor die and/or LDMOS semiconductor die inside a SiGe-based functional substrate having SiGe-based predesigned regions (e.g., predesigned regions 22), GaN-based semiconductor die inside a functional glass substrate having integrated high-Q (e.g., high-quality factor) capacitors, inductors, resistors, and the like at the predesigned regions (e.g., predesigned regions 22).

Figure 3:
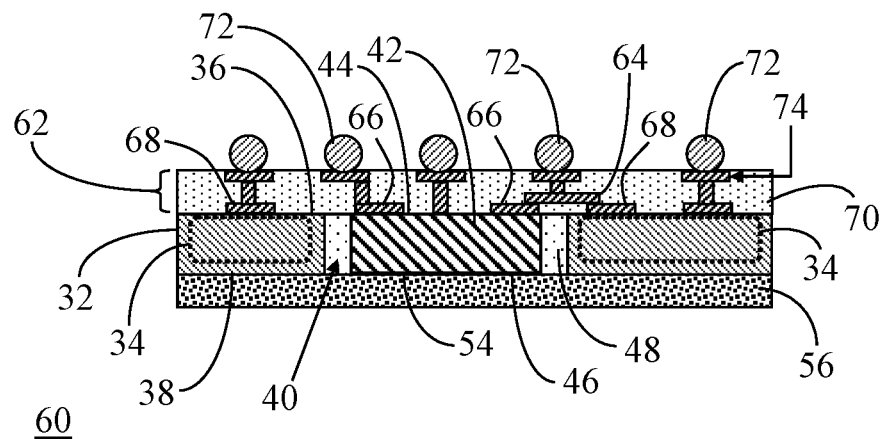
FIG. 3 shows a side view of a device assembly in accordance with another embodiment.

FIG. 3 shows a side view of a device assembly 60 in accordance with another embodiment. Device assembly 60 is similar to device assembly 30 (FIG. 2). As such, elements common to both of assemblies 30, 60 will share the same reference numerals. Device assembly 60 includes functional substrate 32 having one or more electronic components 34 therein, first and second surfaces 36, 38 and cavity 40 extending from first surface 36 toward second surface 38. Semiconductor die 42 is placed within cavity 40 and secured in cavity using dielectric material 48, with pad surface 44 of semiconductor die 42 being opposite to bottom 46 of cavity 40. Backmetal structure 56, serving as a ground plane, may be formed over second surface 38 of functional substrate 32 and over bottom die surface 54 of semiconductor die 42.

In this example, device assembly 60 lacks bond pads 50 (FIG. 2). Instead, device assembly 60 includes a build-up structure 62 formed across first surface 36 of functional substrate 32 and across pad surface 44 of semiconductor die 42. Build-up structure 62 includes at least one layer of electrically conductive patterned material (e.g., referred to herein as patterned metal 64) connected to one or more conductive pads 66 on pad surface 44 of semiconductor die 42. Additional patterned metal 64 may be connected to one or more conductive pads 68 electrically connected to electronic components 34. Still further, patterned metal 64 in build-up structure 62 may electrically interconnect pads 66 on pad surface 44 of semiconductor die 42 with pads 68 electrically connected to electronic components 34.

Various patterned metal traces, formed of patterned metal 64, thus extend through build-up structure 62 and are suitably electrically isolated from one another via layers of dielectric material that make up a dielectric body 70 of build-up structure 62. Electrically conductive connection elements 72 (e.g., solder balls, conductive pillars, and the like) are formed on an outermost layer 74 of patterned metal 64. Thus, patterned metal 64 may be configured to electrically couple one or more pads 66 on pad surface 44 of semiconductor die 42 and/or one or more pads 68 electrically connected to electronic components 34 with one or more electrically conductive connection elements 72.

Build-up structure 62, sometimes referred to as a redistribution layer, constitutes one or more electrically conductive layers (e.g., patterned metal 64) that makes the input/output pads (e.g., outermost layer 74 of conductive patterned metal 64) available in other locations of the chip (e.g., device assembly 60), and to spread out (e.g., "fan-out") the input/output pads so that electrically conductive connection elements 72 can be applied. Thereafter, connection elements 72 may be utilized for bonding with a secondary structure (e.g., printed circuit board, module substrate, another semiconductor device, and the like). Build-up structure 62 with electrically conductive connection elements 72 may yield more controlled interconnects than a traditional wirebond interconnects to beneficially impact high frequency performance.

Figure 4:
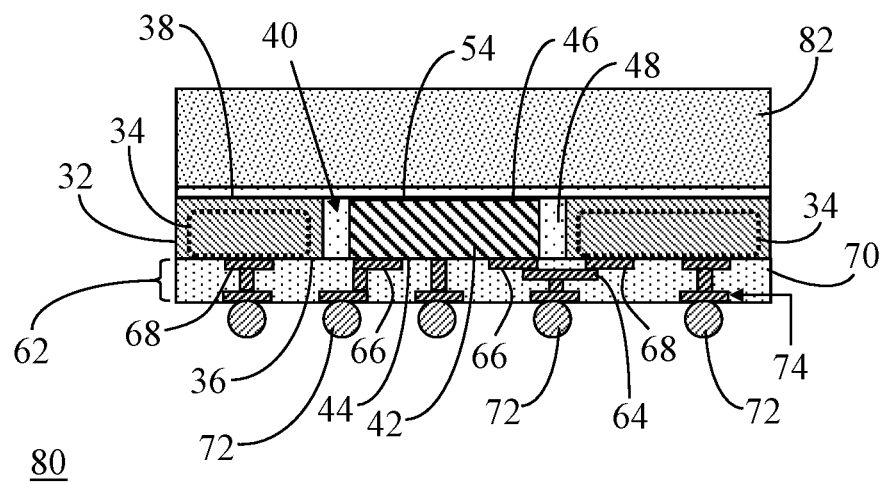
FIG. 4 shows a side view of a device assembly in accordance with another embodiment.

FIG. 4 shows a side view of a device assembly 80 in accordance with another embodiment. Device assembly 80 is similar to device assembly 60 (FIG. 3). As such, elements common to both of assemblies 60, 80 will share the same reference numerals. Device assembly 80 includes functional substrate 32 having one or more electronic components 34 therein, first and second surfaces 36, 38 and cavity 40 extending from first surface 36 toward second surface 38. Semiconductor die 42 is placed within cavity 40 and secured in cavity using dielectric material 48, with pad surface 44 of semiconductor die 42 being opposite to bottom 46 of cavity 40.

Device assembly 80 further includes build-up structure 62 formed across first surface 36 of functional substrate 32 and across pad surface 44 of semiconductor die 42. Build-up structure 62 includes at least one layer of electrically conductive patterned metal 64 connected to one or more conductive pads 66 on pad surface 44 of semiconductor die 42 and/or to one or more conductive pads 68 electrically connected to electronic components 34. Various patterned metal traces, formed of conductive patterned metal 64, thus extend through build-up structure 62 and are suitably electrically isolated from one another via layers of dielectric material that make up a dielectric body 70 of build-up structure 62. Electrically conductive connection elements 72 (e.g., solder balls, conductive pillars, and the like) are formed on an outermost layer 74 of conductive patterned metal 64. In the illustrated configuration, device assembly 80 is flipped upside down relative the illustrated device assembly 60 of FIG. 3. Thus, device assembly 80 may be configured for flip-chip bonding to a secondary structure.

Device assembly 80 lacks backmetal structure 56 (FIG. 3). Instead, device assembly 80 includes a thermally-conductive structure 82, sometimes referred to as a heat sink, formed over or otherwise attached to second surface 38 of functional substrate 32 and over bottom die surface 54 of semiconductor die 42. Thermally-conductive structure 82 (e.g., copper and/or silver sinter) may be implemented to transfer thermal energy away from semiconductor die 42 and/or away from electronic components 34 within functional substrate 32 to thereby enhance thermal performance of device assembly 80. Although device assemblies 30, 60 (FIGS. 2 and 3) include backmetal structure 56 as a ground plane, and device assembly 80 includes thermally-conductive structure 82 as a heat sink, other embodiments may include both backmetal structure 56 and thermally-conductive structure 82. Still other embodiments may include a single structure functioning both as a ground plane and a heat sink.

Figure 5:
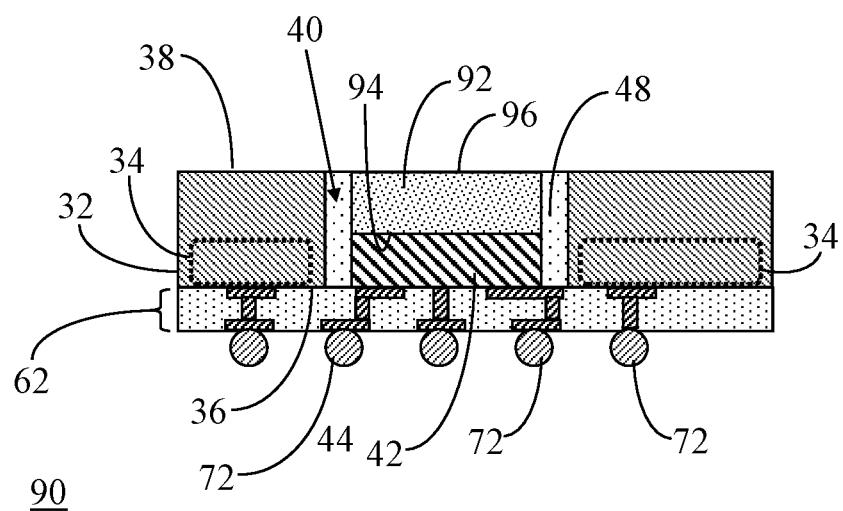
FIG. 5 shows a side view of a device assembly in accordance with another embodiment.

FIG. 5 shows a side view of a device assembly 90 in accordance with another embodiment. Again, device assembly 90 is similar to the previously described device assemblies 30 (FIG. 2), 60 (FIG. 3), and 80 (FIG. 4). As such, elements common to at least some of the previously described device assemblies 30, 60, 80 will share the same reference numerals. Device assembly 90 includes functional substrate 32 having one or more electronic components 34 therein, first and second surfaces 36, 38, cavity 40 extending from first surface 36 toward second surface 38, semiconductor die 42, build-up structure 62, and electrically conductive connection elements 72 (e.g., solder balls, conductive pillars, and the like).

In contrast to the previously discussed device assemblies, device assembly 90 includes a thermally-conductive structure 92 (e.g., heat sink and/or silver sinter) having a first side 94 and a second side 96 opposing first side 94. Thermally-conductive structure 92 is positioned in cavity 40 and semiconductor die 42 is coupled to first side 94 of thermally-conductive structure 92. Thermally-conductive structure 92 and semiconductor die 42 may be secured in cavity 40 utilizing dielectric material 48. In some embodiments, second side 96 of thermally-conductive structure 92 may be exposed from functional substrate 32. Thus, thermally-conductive structure 92 may be utilized to transfer thermal energy away from semiconductor die 42 in a smaller form factor than the thermally-conductive structure 82 (FIG. 4) extending across both second surface 38 of functional substrate 32 and bottom die surface 54 of semiconductor die 42.

Figure 6:
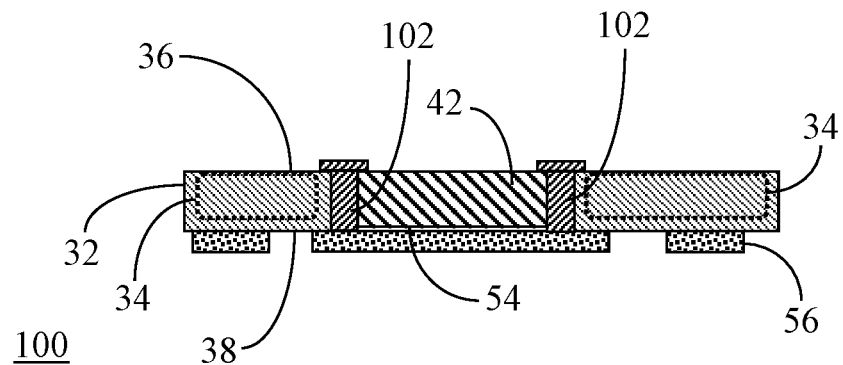
FIG. 6 shows a side view of a device assembly in accordance with another embodiment.

FIG. 6 shows a side view of a device assembly 100 in accordance with another embodiment. Device assembly 100 is similar to those previously described and, as such, shares the same reference numerals. In device assembly 100, backside connection may be implemented as another technique to enable interconnects for next level connections. Accordingly, in device assembly 100, electrically conductive vias 102 may be formed extending through functional substrate. Additionally, backmetal structure 56 (and/or a heat sink) formed over second surface 38 of functional substrate 32 and over bottom die surface 54 may be suitably patterned to connect to the next level for grounding and/or heat dissipation.

Figure 7:
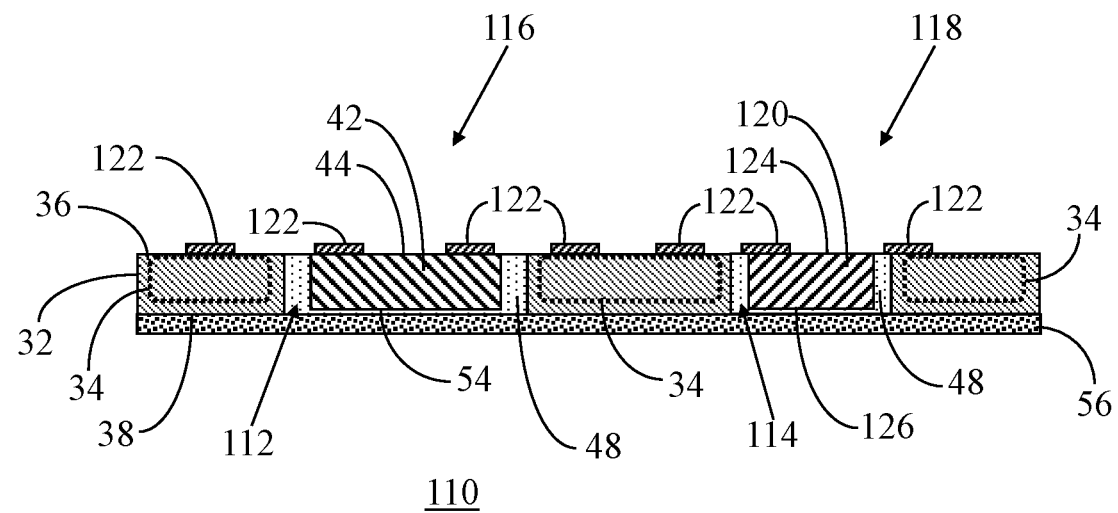
FIG. 7 shows a side view of a device assembly in accordance with another embodiment.

FIG. 7 shows a side view of a device assembly 110 in accordance with another embodiment. The previously described device assemblies included a functional substrate fabricated utilizing a first fabrication technology (e.g., SiGe-based functional substrate, Si-based active and/or passive substrates, dielectric substrate, and so forth) combined with a semiconductor die fabricated utilizing a second fabrication technology (e.g., GaN, GaAs, LDMOS, diamond semiconductors, and so forth). In accordance with another embodiment, device assembly 110 includes an additional integrated semiconductor die which may, in some embodiments be fabricated utilizing another semiconductor fabrication technology.

Accordingly, device assembly 110 includes functional substrate 32 having one or more electronic components 34 formed therein. However, functional substrate 32 includes first and second cavities 112, 114 extending from first surface 36 toward second surface 38 at corresponding locations 116, 118 that lack electronic components 34. In accordance with an embodiment, semiconductor die 42 is placed in and secured within first cavity 112 utilizing dielectric material 48. Another (e.g., second) semiconductor die 120 is placed in and secured within second cavity 114 utilizing dielectric material 48. In this example, bond pads 122 may be formed on first surface 36 of functional substrate 32, on pad surface 44 of semiconductor die 42, and on a pad surface 124 of semiconductor die 120. Bond pads 122 may be used to suitably interconnect electronic components 34 to semiconductor dies 42, 120 via bond wires (not shown) in some configurations. Of course, alternative embodiments may include the build-up structure discussed above.

In this example, device assembly 110 further includes backmetal structure 56 formed over second surface 38 of functional substrate 32, over bottom die surface 54 of semiconductor die 42, and over a bottom die surface 126 of semiconductor die 120. Alternative embodiments may include a thermally-conductive structure (e.g., heat sink), both a backmetal structure and a heat sink, and/or a patterned backmetal structure as discussed above. And still other embodiments may include a thermally-conductive structure (e.g., heat sink) positioned in one or both cavities 112, 114, also as discussed above.

In an example, functional substrate 32 may be a SiGe-based substrate, semiconductor die 42 may be a GaN-based semiconductor die, and semiconductor die 120 may be an LDMS-based semiconductor die. Thus, device assembly 110 represents a more complex integration of elements into a single package that may be manufactured utilizing different semiconductor fabrication technologies. It should be understood that a wide variety of hybrid, or integrated, device assemblies may be envisioned that include two or more semiconductors dies integrated therein. Further, although a configuration is discussed that includes two semiconductor dies manufactured using different fabrication technologies, alternative configurations may include two or more semiconductor dies that are fabricated using the same fabrication technology, but the dies may have different components fabricated therein and/or have different functions and/or need to be spaced apart in functional substrate 32 to accommodate electronic components 34 within functional substrate 32.

Figure 8:
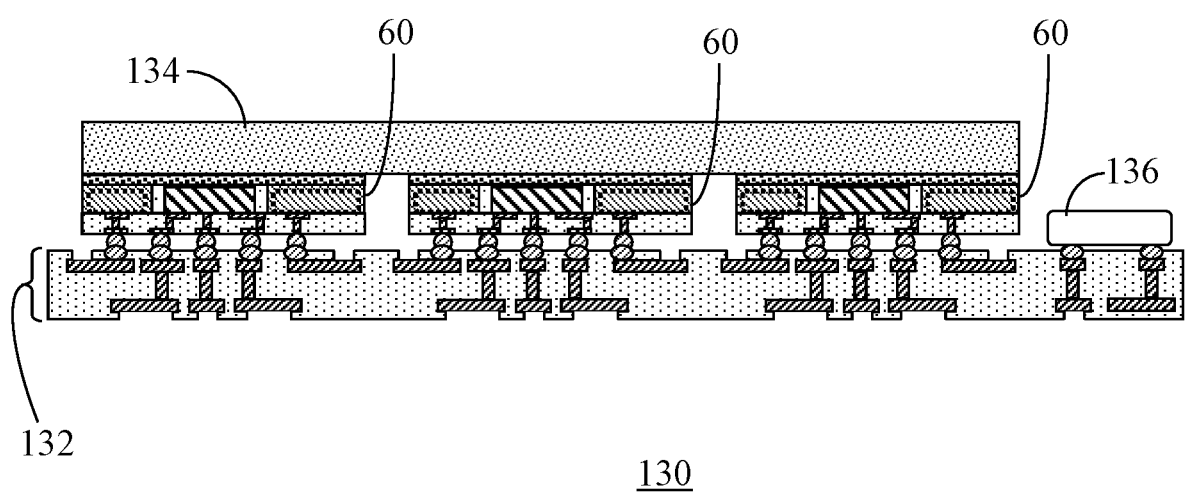
FIG. 8 shows a side view of a module that includes multiple device assemblies.

FIG. 8 shows a side view of a module 130 that includes multiple device assemblies (e.g., device assemblies 60). Module 130 may be configured as, for example, a wafer level chip scale package (WLCSP) or a fan-out wafer level chip scale (FOWLCSP) package. The multiple device assemblies 60 may be coupled to a subassembly 132. Additionally, a large thermally-conductive structure 134 (e.g., one global heat sink) may be coupled to each of device assemblies 60. Additional components 136, such as an antenna, (one shown) may be integrated into subassembly 132.

Figure 9:
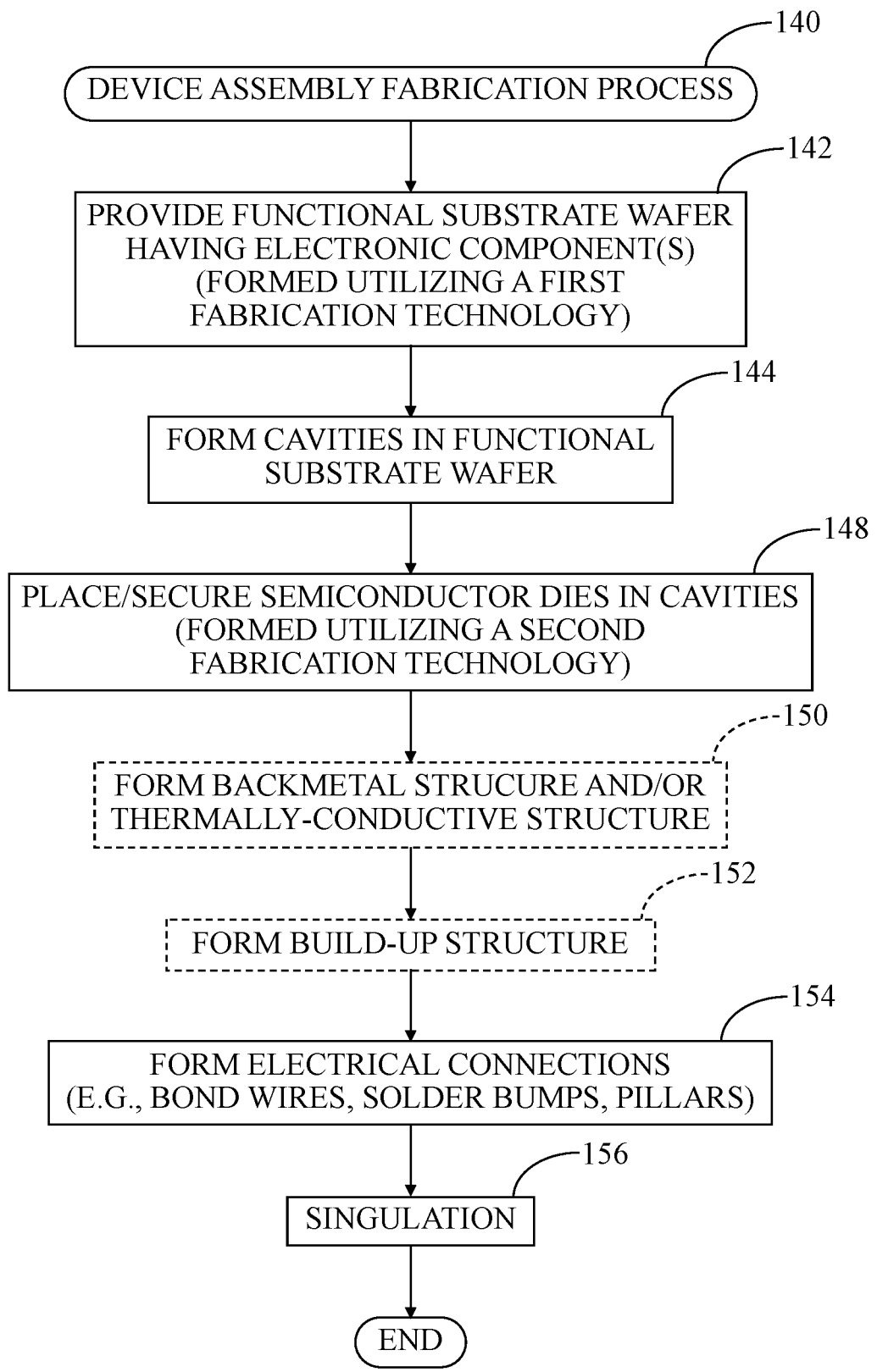
FIG. 9 shows a flowchart of a device assembly fabrication process in accordance with another embodiment.

FIG. 9 shows a flowchart of a device assembly fabrication process 140 in accordance with another embodiment. Fabrication process 140 may be utilized to produce any of the hybrid device assemblies describe above or any variations thereof.

At a block 142, a functional substrate wafer (functional wafer 20, FIG. 1, used to form functional substrate 32, FIGS. 2-7) having one or more electronic components (electronic components 34) formed in predesigned regions (e.g., predesigned regions 22, FIG. 1) is provided. The functional substrate wafer may be formed utilizing a first fabrication technology (e.g., SiGe, Si-based IPD, Si-LDMOS, dielectric, glass, and so forth).

Figure 10:
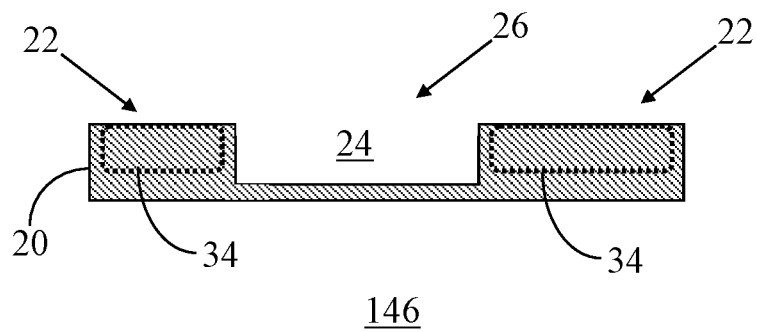
FIG. 10 shows a side view of a structure at an initial stage of processing in accordance with the device assembly fabrication process of FIG. 9.

At a block 144, cavities (e.g., cavities 24) are formed in the functional substrate wafer. The cavities may be formed with plasma etching or typical silicon etching methods. In an example, cavities in a glass substrate wafer may be formed through selective crystallization and dissolution. Referring to FIG. 10 in connection with operational block 144, FIG. 10 shows a side view of a structure 146 at an initial stage of processing in accordance with cavity formation block 144 of device assembly fabrication process 140. For simplicity, structure 146 represents a portion of functional wafer 20 used to form any one of device assemblies 30 (FIG. 2), 60 (FIG. 3), 80 (FIG. 4), and 100 (FIG. 6), following the formation of one of cavities 24. Those skilled in the art will recognize that a multiplicity of cavities 24 will be concurrently formed at locations 26 outside of predesigned regions 22 at which the electronic components 34 are located.

Figure 11:
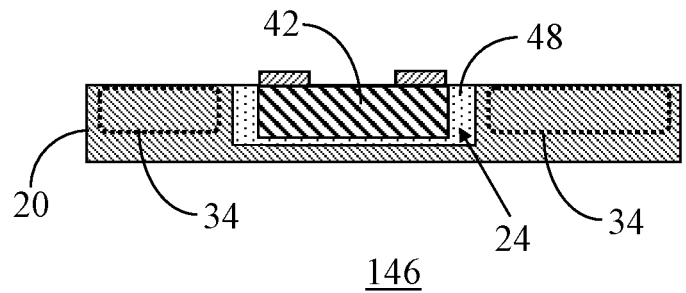
FIG. 11 shows a side view of the structure of FIG. 10 at a subsequent stage of processing.

With reference back to FIG. 9, following formation of the cavities in the functional substrate wafer at cavity formation block 144, process flow continues with a block 148. At block 148, semiconductor dies (e.g., semiconductor dies 42, FIGS. 2-7) are placed within and secured in the cavities. Referring to FIG. 11 in connection with operational block 148, FIG. 11 shows a side view of structure 146 at a subsequent stage of processing in accordance with semiconductor die placement block 148. At this subsequent stage of processing, semiconductor dies 42 (one shown) may be secured in the multiplicity of cavities 24 (one shown) utilizing dielectric material 48. Of course, as described in connection with device assembly 90 of FIG. 5, operational block 148 may additionally entail securing a heat sink the cavity and securing the semiconductor die may then be secured on the head sink in the cavity.

With reference back to FIG. 9, following semiconductor die placement block 148 a number of operations may be performed that may be optional depending upon a predetermined configuration of the device assemblies being fabricated. These "optional" operations are represented in dashed line form to indicate that they may or may not be performed. At a block 150, a backmetal structure and/or thermally-conductive structure (e.g., heat sink) may be formed. In an example, the functional substrate wafer may be suitably thinned using a backgrinding process to expose semiconductor die 42. Thereafter, the backmetal structure and/or thermally-conductive structure may be attached to the bottom die surface (e.g., bottom die surface 54, FIGS. 2-7) and the back side (e.g., of the functional substrate wafer.

Figure 12:
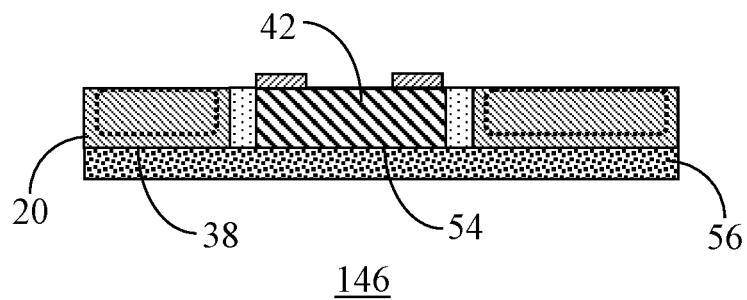
FIG. 12 shows a side view of the structure of FIG. 11 at a subsequent stage of processing.

Referring to FIG. 12 in connection with operational block 150, FIG. 12 shows a side view of structure 146 at a subsequent stage of processing in accordance with attachment block 150. At this subsequent stage of processing, functional substrate wafer 20 has been suitably thinned and bottom die surface 54 of semiconductor die 42 is exposed. Backmetal structure 56 is attached to second surface 38 of functional substrate wafer 20 and to bottom die surface 54 of semiconductor die 42 using, for example, an electrically conductive adhesive material. When a dielectric functional substrate wafer (e.g., a glass wafer) is being used, the wafer may not be thinned. Rather, the backmetal structure and/or thermally-conductive material may simply be adhered to the back side of the dielectric functional substrate wafer.

With reference back to FIG. 9, device assembly fabrication process 140 may optionally continue with a block 152. At block 152, a build-up structure (e.g., build-up structure 62, FIGS. 3-5) may be formed as discussed above. At a block 154, electrical connections may be formed. These electrical connections could entail bond wires (as discussed in connection with the example of FIG. 2) or solder bumps or conductive pillars on the build-up structure (as discussed in connection with the examples of FIGS. 3-5). At a block 156, a singulation process may be performed by cutting, dicing, sawing, or otherwise separating the functional substrate wafer (e.g., functional wafer 20, FIG. 1) into individual devices assemblies. Thereafter, device assembly fabrication process 140 may end.

Thus, execution of the methodology described herein enables the fabrication of hybrid device assemblies formed utilizing a functional substrate and having semiconductor dies integrated therein. It should be understood that certain ones of the process blocks depicted in FIG. 9 may be performed in parallel with each other or while performing other processes, or may optionally be performed in some embodiments. In addition, the particular ordering of the process blocks depicted in FIG. 9 may be modified while achieving substantially the same result. Accordingly, such modifications are intended to be included within the scope of the inventive subject matter.

Embodiments described herein entail device assemblies and methodology for fabricating the device assemblies. More particularly, integrated or hybrid device assemblies are provided, as well as integration methodology of various active and passive components. Device assemblies with combinations of various active device technology and passive device technology may provide design flexibility to yield optimal device configurations and cost reductions. For example, a lower cost based device technology with added performance enhancements may be integrated with higher cost devices to provide performance advantages. Further, controlled interconnects may be utilized on such integrated device assemblies for enhanced high frequency (e.g., radio frequency, RF) performance. Additionally, the die backside may be exposed for thermal dissipation to enhance thermal performance.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device assembly comprising:
   a functional semiconductor substrate having a first surface and a second surface opposing the first surface, the functional semiconductor substrate having at least a first electronic component integrally formed therein from a volume of semiconductor material that is a portion of the functional semiconductor substrate between the first surface and the second surface, and the functional semiconductor substrate having a cavity extending from the first surface toward the second surface at a location that lacks the first electronic component; and
   a semiconductor die placed within the cavity with a pad surface of the semiconductor die being opposite to a bottom of the cavity.

2. The device assembly of claim 1 wherein the one or more electronic components of the functional semiconductor substrate include at least one of an active component and a passive component formed in a predesigned region of the functional semiconductor substrate.

3. The device assembly of claim 1 wherein the functional semiconductor substrate is formed utilizing a first fabrication technology and the semiconductor die is formed utilizing a second fabrication technology, wherein the second fabrication technology differs from the first fabrication technology.

4. The device assembly of claim 1 wherein:
the functional semiconductor substrate is one of a silicon-germanium-based substrate, a silicon-based integrated passive device substrate, a silicon-based laterally-diffused metal-oxide-semiconductor substrate; and
the semiconductor die comprises a gallium nitride-based die.

5. The device assembly of claim 1 wherein:
the cavity is a first cavity;
the semiconductor die is a first semiconductor die;
the functional semiconductor substrate having a second cavity extending from the first surface toward the second surface at a location that lacks the one or more electronic components; and
the device assembly further comprises a second semiconductor device placed within the second cavity with a second pad surface of the second semiconductor die being opposite to a second bottom of the second cavity.

6. The device assembly of claim 5 wherein the first and second semiconductor dies are fabricated using different fabrication technologies.

7. The device assembly of claim 1 wherein:
the semiconductor die has a bottom die surface opposing the pad surface, the bottom die surface being exposed from the functional semiconductor substrate at the second surface; and
the device assembly further comprises at least one of a backmetal structure and a thermally-conductive structure formed over the second surface of the functional semiconductor substrate and over the bottom die surface of the semiconductor die.

8. The device assembly of claim 1 further comprising a thermally-conductive structure having a first side and a second side opposing the first side, the thermally-conductive structure being positioned in the cavity and the semiconductor die being coupled to the first side of the thermally-conductive structure.

9. The device assembly of claim 8 wherein the second side of the thermally-conductive structure is exposed from the functional semiconductor substrate at the second surface.

10. The device assembly of claim 1 further comprising:
a build-up structure formed across the first surface of the functional semiconductor substrate and the pad surface of the semiconductor die, the build-up structure including at least one layer of electrically conductive patterned material connected to a pad on the pad surface of the semiconductor die; and
an electrically conductive connection element formed on an outermost layer of the patterned material, wherein the patterned material is configured to electrically couple the pad on the pad surface of the semiconductor die with the electrically conductive connection element.

11. A method of fabricating a device assembly comprising:
providing a functional semiconductor substrate having a first surface and a second surface opposing the first surface, the functional semiconductor substrate having one or more electronic components formed therein;
forming a cavity extending from the first surface into the functional semiconductor substrate toward the second surface at a location that lacks the one or more electronic components; and
placing a semiconductor die within the cavity with a pad surface of the semiconductor die being opposite to a bottom of the cavity.

12. The method of claim 11 further comprising:
utilizing a first fabrication technology to form the functional semiconductor substrate; and
utilizing a second fabrication technology to form the functional semiconductor substrate, the second fabrication technology differing from the first fabrication technology.

13. The method of claim 11 further comprising:
forming the functional semiconductor substrate from one of a silicon-germanium-based substrate, a silicon-based integrated passive device substrate, a silicon-based laterally-diffused metal-oxide semiconductor substrate, and a dielectric substrate; and
forming the semiconductor device as a gallium nitride-based die.

14. The method of claim 11 wherein the semiconductor die has a bottom die surface opposing the pad surface, and the method further comprises:
exposing the bottom die surface of the semiconductor die from the functional semiconductor substrate at the second surface; and
forming at least one of a backmetal structure and a thermally-conductive structure over the second surface of the functional substate and over the bottom die surface of the die.

15. The method of claim 11 further comprising:
positioning a thermally-conductive structure in the cavity, the thermally-conductive structure having a first side and a second side opposing the first side; and
the placing operation comprises coupling the semiconductor die to the first side of the thermally conductive structure.

16. The method of claim 15 further comprising exposing the second side of the thermally-conductive structure from the functional semiconductor substrate at the second surface.

17. The method of claim 11 further comprising:
forming a build-up structure across the first surface of the functional semiconductor substrate and the pad surface of the semiconductor die, the build-up structure including at least one layer of electrically conductive patterned material connected to a pad on the pad surface of the semiconductor die; and
forming an electrically conductive connection element on an outermost layer of the patterned material, wherein the patterned material is configured to electrically couple the pad on the pad surface of the semiconductor die with the electrically conductive connection element.

18. A device assembly comprising:
a functional semiconductor substrate having a first surface and a second surface opposing the first surface, the functional semiconductor substrate having one or more electronic components formed therein, the electronic components including at least one of an active component and a passive component integrally formed from predesigned regions of the functional semiconductor substrate, and the functional semiconductor substrate having a cavity extending from the first surface toward the second surface at a location that lacks the one or more electronic components;

a semiconductor die placed within the cavity with a pad surface of the semiconductor die being opposite to a bottom of the cavity;

a build-up structure formed across the first surface of the functional semiconductor substrate and the pad surface of the semiconductor die, the build-up structure including at least one layer of electrically conductive patterned material connected to a pad on the pad surface of the semiconductor die, wherein the semiconductor die and the build-up structure jointly fill the cavity; and an electrically conductive connection element formed on an outermost layer of the patterned material, wherein the patterned material is configured to electrically couple the pad on the pad surface of the semiconductor die with the electrically conductive connection element.

19. The device assembly of claim 18 wherein:

the semiconductor die has a bottom die surface opposing the pad surface, the bottom die surface being exposed from the functional semiconductor substrate at the second surface; and the device assembly further comprises at least one of a backmetal structure and a thermally-conductive structure formed over the second surface of the functional semiconductor substrate and over the bottom die surface.

20. The device assembly of claim 18 further comprising a thermally conductive structure having a first side and a second side opposing the first side, the thermally-conductive structure being positioned in the cavity and the semiconductor die being coupled to the first side of the thermally conductive structure.

* * * * *